US010816910B2

(12) United States Patent
Butler et al.

(10) Patent No.: US 10,816,910 B2
(45) Date of Patent: Oct. 27, 2020

(54) VIBRATION ISOLATOR, LITHOGRAPHIC APPARATUS AND DEVICE MANUFACTURING METHOD

(71) Applicant: ASML Netherlands B.V., Veldhoven (NL)

(72) Inventors: Hans Butler, Best (NL); Cornelius Adrianus Lambertus De Hoon, Eindhoven (NL); Fransiscus Mathijs Jacobs, Asten (NL); Pavel Kagan, Eindhoven (NL); Jeroen Pieter Starreveld, Eindhoven (NL); Maurice Willem Jozef Etienne Wijckmans, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/079,169

(22) PCT Filed: Feb. 3, 2017

(86) PCT No.: PCT/EP2017/052343
§ 371 (c)(1),
(2) Date: Aug. 23, 2018

(87) PCT Pub. No.: WO2017/148650
PCT Pub. Date: Sep. 8, 2017

(65) Prior Publication Data
US 2019/0049852 A1 Feb. 14, 2019

(30) Foreign Application Priority Data
Mar. 3, 2016 (EP) ..................................... 16158497

(51) Int. Cl.
*G03F 7/20* (2006.01)
*F16F 9/02* (2006.01)
(Continued)

(52) U.S. Cl.
CPC ............ *G03F 7/709* (2013.01); *F16F 9/0209* (2013.01); *F16F 13/00* (2013.01);
(Continued)

(58) Field of Classification Search
CPC ....... G03F 7/709; F16F 9/0209; F16F 9/0227; F16F 9/165
See application file for complete search history.

(56) References Cited

U.S. PATENT DOCUMENTS 4,424,961 A  1/1984  Takei
6,547,225 B1*  4/2003  Nelson .................... F16F 9/049
248/631
(Continued)

FOREIGN PATENT DOCUMENTS

CN  102062125 A  5/2011
CN  102734379 A  10/2012
(Continued)

OTHER PUBLICATIONS

Wiebo van Toledo, European International Searching Authority, International Search Report, counterpart PCT Application No. PCT/EP2017/052343, dated May 12, 2017, 5 pages total.
(Continued)

*Primary Examiner* — Steven Whitesell Gordon
(74) *Attorney, Agent, or Firm* — DiBerardino McGovern IP Group LLC

(57) ABSTRACT

The invention relates to a vibration isolator, comprising:
a base;
a coupling element to be coupled to a vibration sensitive object;
a decoupling mass;
a first vibration isolator part arranged between the base and the decoupling mass; and
a second vibration isolator part arranged between the decoupling mass and the coupling element,
(Continued)

and wherein at least one of the first and second vibration isolator part comprises a pneumatic isolator.

27 Claims, 5 Drawing Sheets

(51) Int. Cl.
*F16F 15/023* (2006.01)
*F16F 13/00* (2006.01)
*F16F 15/027* (2006.01)

(52) U.S. Cl.
CPC ...... *F16F 15/0232* (2013.01); *G03F 7/70841* (2013.01); *F16F 15/0275* (2013.01); *F16F 2222/126* (2013.01); *F16F 2228/066* (2013.01); *F16F 2232/08* (2013.01)

(56) References Cited

U.S. PATENT DOCUMENTS

| | | | | |
|---|---|---|---|---|
| 6,590,639 | B1* | 7/2003 | Yuan | G03F 7/70825 248/550 |
| 6,987,559 | B2* | 1/2006 | Phillips | F16F 15/0275 355/53 |
| 2004/0000215 | A1 | 1/2004 | Phillips et al. | |
| 2004/0017167 | A1* | 1/2004 | Nishi | F16F 15/0275 318/114 |
| 2004/0080729 | A1 | 4/2004 | Phillips et al. | |
| 2004/0187616 | A1* | 9/2004 | Watson | F16J 3/048 74/18.2 |
| 2008/0013058 | A1* | 1/2008 | Tatsuzaki | F16F 9/52 355/53 |
| 2008/0079204 | A1* | 4/2008 | Pletner | F16F 9/0218 267/64.17 |
| 2008/0230677 | A1 | 9/2008 | De Hoon | |
| 2008/0237947 | A1* | 10/2008 | Warmerdam | B60G 17/0157 267/75 |
| 2009/0180091 | A1* | 7/2009 | Farnsworth | F16F 9/06 355/67 |
| 2012/0154774 | A1* | 6/2012 | Van Der Wijst | G03F 7/708 355/53 |
| 2014/0374565 | A1* | 12/2014 | Tan | F16F 15/023 248/542 |
| 2016/0004170 | A1 | 1/2016 | Van Der Wijst et al. | |

FOREIGN PATENT DOCUMENTS

| | | |
|---|---|---|
| DE | 2807160 A1 | 8/1979 |
| DE | 102008054429 A1 | 7/2009 |
| EP | 2540452 A1 | 1/2013 |
| FR | 2705416 A1 | 11/1994 |
| FR | 2708696 A1 | 2/1995 |
| JP | 2000249185 A | 9/2000 |
| JP | 2004063653 A | 2/2004 |
| JP | 2004525315 A | 8/2004 |
| JP | 2004273491 A | 9/2004 |
| JP | 2005214244 A | 8/2005 |
| JP | 2005308145 A | 11/2005 |
| JP | 2007522393 A | 8/2007 |
| JP | 2008235889 A | 10/2008 |
| JP | 2011503887 A | 1/2011 |
| JP | 2012134486 A | 7/2012 |
| WO | 0240888 A1 | 5/2002 |
| WO | 2005083294 A1 | 9/2005 |

OTHER PUBLICATIONS

Wiebo van Toledo European International Searching Authority, Written Opinion, counterpart PCT Application No. PCT/EP2017/052343, dated May 12, 2017, 7 pages total.

Office Action, counterpart Japanese Patent Application No. 2018-543357, dated Sep. 27, 2019, 11 pages total (including English translation of 6 pages).

Office Action, counterpart Chinese Patent Application No. 201780014623.6 dated Jan. 10, 2020, 13 pages total (including English translation of 7 pages).

Office Action with Search Report, counterpart Chinese Patent Application No. 201780014623.6 dated Aug. 20, 020, 16 pages total (including English translation of 8 pages).

* cited by examiner

VIBRATION ISOLATOR, LITHOGRAPHIC APPARATUS AND DEVICE MANUFACTURING METHOD

CROSS-REFERENCE TO RELATED APPLICATIONS

This application claims priority of EP application 16158497.4 which was filed on Mar. 3, 2016 and which is incorporated herein in its entirety by reference.

BACKGROUND

Field of the Invention

The present invention relates to a vibration isolator, a lithographic apparatus and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to ensure that the pattern is appropriately projected onto the target portion, it is important to ensure that the target portion is accurately positioned relative to the patterned radiation beam. As such, considerable effort is spent in ensuring that the position of the patterned radiation beam does not displace due to vibrations. Hence, different components of the lithographic apparatus may be supported by means of one or more vibration isolators comprising pneumatic isolators. As accuracy requirements become more stringent, such vibration isolators may however not be sufficient to reduce the effect of vibrations on the performance of the lithographic apparatus such as overlay due to for instance isolation saturation in the pneumatic isolators limiting the maximum achievable isolation.

SUMMARY

It is desirable to improve the vibrational isolation of a vibration isolator comprising a pneumatic isolator. In order to realize this, there is provided, according to an embodiment of the invention, a vibration isolator comprising:
a base;
a coupling element to be coupled to a vibration sensitive object;
a decoupling mass;
a first vibration isolator part arranged between the base and the decoupling mass; and
a second vibration isolator part arranged between the decoupling mass and the coupling element,
and wherein at least one of the first and second vibration isolator part comprises a pneumatic isolator.

In another embodiment of the invention, there is provided a lithographic apparatus comprising:
a vibration sensitive object;
a vibration isolator supporting the vibration sensitive object, comprising:
a base;
a coupling element coupled to the vibration sensitive object;
a decoupling mass;
a first vibration isolator part arranged between the base and the decoupling mass; and
a second vibration isolator part arranged between the decoupling mass and the coupling element,
and wherein at least one of the first and second vibration isolator part comprises a pneumatic isolator.

According to an embodiment of the invention, there is provided a device manufacturing method comprising projecting a patterned beam of radiation onto a substrate, using a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
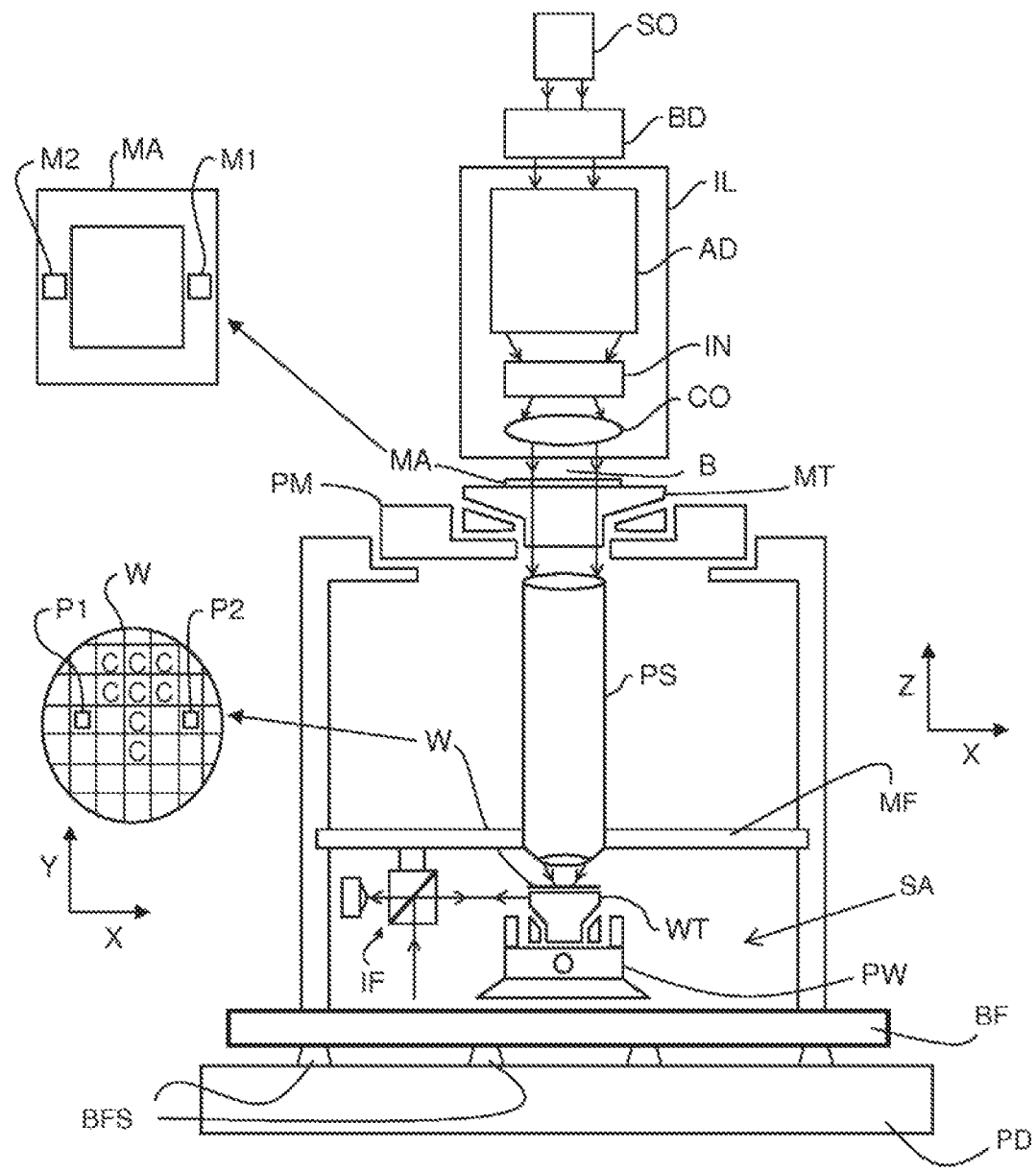
FIG. 1 depicts a lithographic apparatus according to a first embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. In accordance with the present invention, the substrate W may be displaced relative to the projection system PS by means of a stage assembly SA, the stage assembly SA comprising a substrate table WT, which is constructed to hold the substrate W; and the positioning device PW that is configured to displace the substrate table WT relative to the projection system PS.

With the aid of the positioning device PW and a position sensor IF (e.g. an interferometric device, linear encoder or capacitive sensor), the substrate table WT can be moved accurately, e.g. so as to position different target portions C in the path of the radiation beam B. Similarly, the positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which may form part of the positioning device PM. Similarly, movement of the substrate table WT or "substrate support" may be realized using a long-stroke module and a short-stroke module, which form part, in an embodiment of the present invention, of the positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the sire of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In accordance with the present invention, the lithographic apparatus further comprises a base frame BF onto which the stage assembly SA and the projection system PS are mounted. In the embodiment as shown, the projection system PS is mounted to a so-called metrology frame MF, which may be mounted onto the base frame BF by means of vibration isolators such as air mounts or the like. In the embodiment as shown, the base frame BF is mounted to a pedestal PD by means of base frame supports BFS. As an alternative, the base frame BF may also be mounted onto a ground floor or factory floor.

In a lithographic apparatus, a substrate stage WT is displaced relative to projection system PS in order to project a pattern onto each target portion C on the substrate W. Due to said displacement, the stage assembly SA may exert a force and/or torque on the base frame BF supporting the stage assembly SA. Resulting vibrations could, in case no measures are taken, propagate towards the projection system PS. Therefore, the projection system PS is mounted to the base frame BF via vibration isolators.

Figure 2:
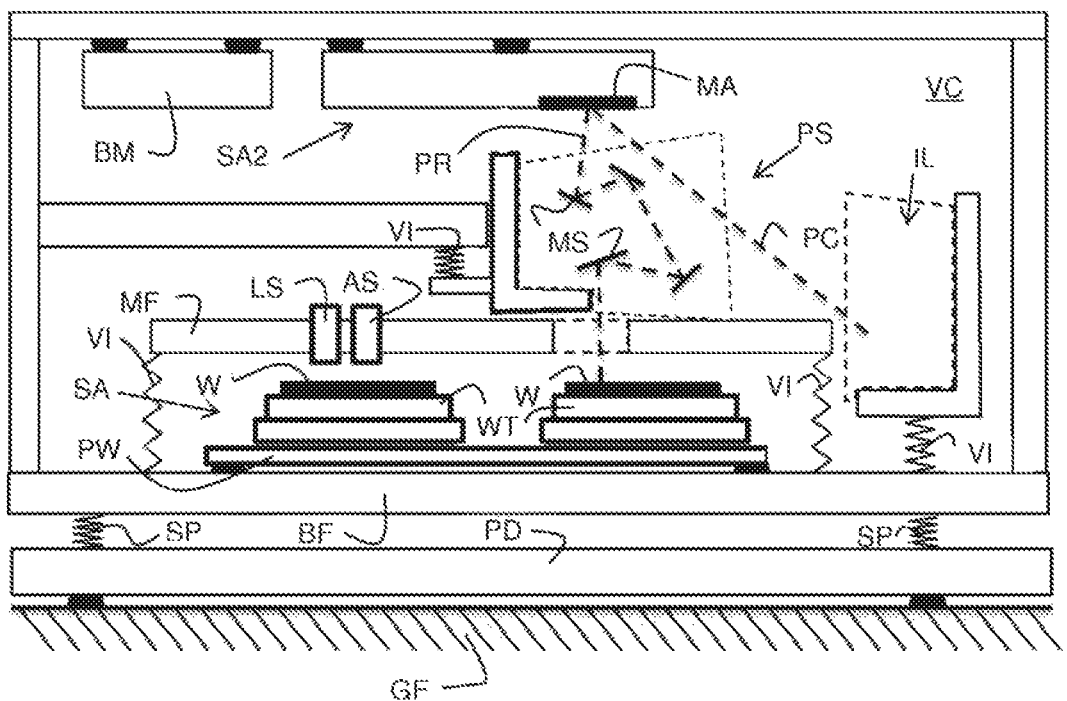
FIG. 2 depicts a lithographic apparatus according to a second embodiment of the invention.

FIG. 2 schematically illustrates a possible lay-out of a lithographic apparatus according to a second embodiment of the invention. FIG. 2 schematically shows a cross-sectional view of an EUV-type lithographic apparatus including an illumination system IL and a projection system PS, the projection system PS comprising a plurality of mirrors MS configured to redirect a patterned beam PR of radiation onto a substrate W that is mounted on a substrate table WT. In the arrangement as shown, the substrate table WT forms part of a dual stage assembly SA that includes two substrate tables WT that can be displaced by a positioning device PW, e.g. a planar motor assembly or a linear motor assembly. In the arrangement as shown, the illumination system IL projects a conditioned beam PC of radiation onto a patterning device MA (in this case a reflective patterning device) to generate the patterned beam of radiation PR. The patterning device MA is mounted to a second stage assembly SA2, e.g. including an object table to hold the patterning device MA and a positioning device for positioning the patterning device MA. The stage assembly may e.g. include a balance mass BM onto which reaction forces can be exerted. The arrangement as shown further comprises a vibrationally isolated frame, e.g. a metrology frame MF, onto which position measurement devices may be mounted or measurement devices to characterize a substrate prior to exposure, such measurement devices e.g. including a level sensor LS for determining a height map of a substrate W' and an alignment sensor AS for determining a position of alignment marks on the substrate W'. In the arrangement as shown, the stage assemblies, the illumination system IL, the metrology frame and the projection system PS are all mounted (either directly or via vibration isolators VI) to a common base frame BF, the base frame BF forming a bottom of a vacuum chamber VC enclosing the stage assemblies, the illumination system IL, the metrology frame and the projection system PS. In the arrangement as shown, the base frame BF is mounted to a pedestal PD via comparatively stiff supports SP, the pedestal PD being mounted on a ground floor GF.

One or more of the vibration isolators (VI) mentioned or shown in relation to FIGS. 1 and 2 are vibration isolators according to the invention, comprising
a base;
a coupling element to be coupled to a vibration sensitive object;
a decoupling mass;
a first vibration isolator part arranged between the base and the decoupling mass; and
a second vibration isolator part arranged between the decoupling mass and the coupling element,
and wherein at least one of the first and second vibration isolator part comprises a pneumatic isolator.

Figure 3:
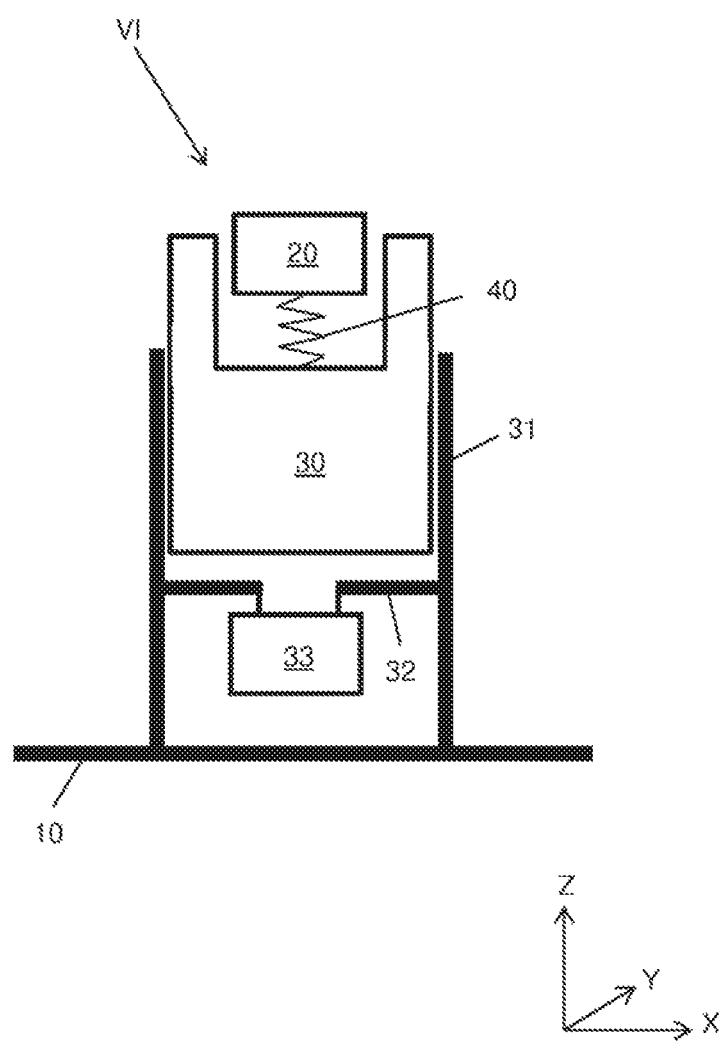
FIG. 3 depicts schematically a vibration isolator according to an embodiment of the invention.
Figure 4:
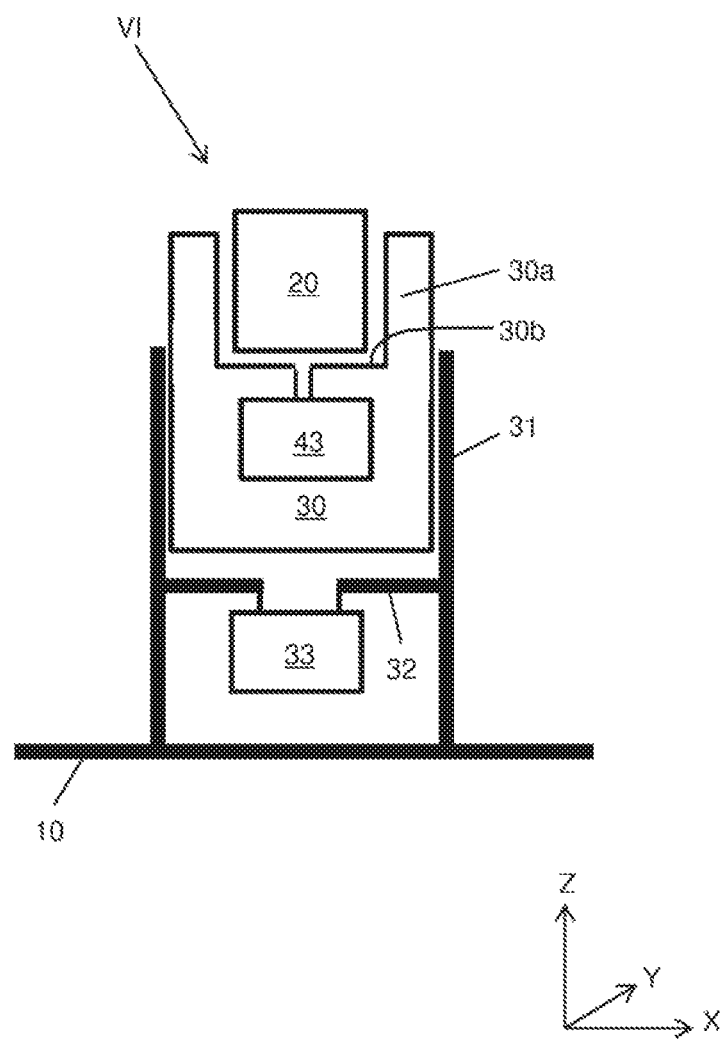
FIG. 4 schematically depicts a vibration isolator according to another embodiment of the invention.

FIGS. 3 and 4 depict possible embodiments of such vibration isolators according to the invention and will be elucidated below.

FIG. 3 schematically depicts a vibration isolator VI according to the invention, comprising a base 10 that can for instance be mounted to or be part of the base frame BF shown in FIGS. 1 and 2.

The vibration isolator further comprises a coupling element 20 to be coupled to a vibration sensitive object, e.g. the metrology frame MF of FIGS. 1 and 2 or one of the frame parts holding the illumination system IL or projection system PS.

In between the base 10 and the coupling element 20 a decoupling mass 30 is provided, which decoupling mass 30 is connected to the base via a first vibration isolator part and is connected to the coupling element 20 via a second vibration isolator part 40.

The first vibration isolator part is formed by a cylinder 31 with a bottom 32 in which the decoupling mass 30 is received acting as a piston in the cylinder 31. The decoupling mass 30 is able to move freely within the cylinder 31 in Z-direction and possibly a rotational direction about the Z-direction, the so-called Rz-direction, and is supported from the bottom 32 of the cylinder 31 by compressed air provided between the bottom 32 and the decoupling mass 30 by an air supply 33, which may comprise an air tank and/or air compressor (not shown).

Compressed air is also provided between the decoupling mass 30 and the cylinder 31 thereby forming an air bearing providing stiffness in the X-, Y-, Rx- and Ry-directions, wherein the Rx- and Ry-direction correspond to rotations about the X-direction and Y-direction respectively.

The first vibration isolator part thus provides an air spring having a first static spring stiffness k1 between the base 10 and the decoupling mass 30.

The second vibration isolator part is in this embodiment a mechanical element having a spring-like behavior, e.g. a coil spring, a leaf spring or any constructional element having the similar characteristics, e.g. actively controlled devices.

The second vibration isolator part thus provides a spring having a second static spring stiffness k2 between the decoupling mass 30 and the coupling element 20.

Compared to a vibration isolator comprising a single vibration isolator part providing an air spring similar to the first vibration isolator part, isolation saturation due to acoustic resonances in the vibration isolator part occurs at a higher frequency thereby improving the vibration isolation performance of the vibration isolator VI.

Further, the decoupling mass will decouple at a frequency corresponding to the sum of the first and second static spring stiffness, resulting in a steeper slope of the transmissibility after the decoupling frequency which also has a positive effect on the vibration isolation performance.

Although not shown, it will be apparent for the skilled person that in the embodiment of FIG. 3, the spatial order of the first and second vibration isolator part could also have been the other way around, meaning that the first vibration isolator part as pneumatic isolator could have been provided between the decoupling mass 30 and the coupling element 20, and the second vibration isolator part 40 could have been provided between the decoupling mass 30 and the base 10.

The decoupling mass 30 is a constructional element that is freely moveable to allow the mass to decouple at a frequency corresponding to the first and second static spring stiffness, and thus mainly connected to the first and second vibration isolator parts. Hence, the decoupling mass does not directly support other components of the lithographic apparatus and other components are also not configured to apply significant direct forces to the decoupling mass. If this would be the case, the decoupling function of the decoupling mass would be lost.

As indicated in this embodiment, the decoupling mass may be part of the pneumatic isolator. In the embodiment of FIG. 3, the decoupling mass is the piston part, but in an alternative embodiment, the decoupling mass may also be embodied as cylinder part of the pneumatic isolator.

Even when the decoupling mass is not part of the pneumatic isolator, the base or coupling element may comprise a chamber in which the decoupling mass is displaceably arranged.

In an embodiment, the outer dimensions of the decoupling mass in plane view are smaller than the outer dimensions of the base and/or coupling element.

FIG. 4 schematically depicts another embodiment of a vibration isolator VI according to the invention, wherein the configuration of the vibration isolator and the first vibration isolator part are similar to the embodiment of the vibration isolator VI of FIG. 3. The main difference between the two embodiments lies in the configuration of the second vibration isolator part.

In the embodiment of FIG. 4, the second vibration isolator part is also a pneumatic isolator, which in this configuration is integrated into the decoupling mass 30. The decoupling mass 30 forms a cylinder portion 30a with a bottom 30b to receive the coupling element 20. The coupling element 20 is able to move freely within the cylinder portion 30a in Z-direction and possibly also in a rotational direction about the Z-direction, the so-called Rz-direction. The coupling element 20 is supported from the bottom 30b of the cylinder portion 30a by compressed air provided between the bottom 30b and coupling element 20 by an air supply 43, which may comprise an air tank and/or air compressor (not shown).

Compressed air is also provided between the coupling element 20 and the cylinder portion 30a thereby forming an air bearing providing stiffness in the X-, Y-, Rx- and Ry-directions, wherein the Rx- and Ry-direction correspond to rotations about the X-direction and Y-direction respectively.

The second vibration isolator part thus provides an air spring having a second static spring stiffness k2 between the decoupling mass 30 and the coupling element 20.

Compared to a vibration isolator comprising a single vibration isolator part providing an air spring similar to the first vibration isolator part, isolation saturation due to acoustic resonances in the first and second vibration isolator part occur at a higher frequency thereby improving the vibration isolation performance of the vibration isolator VI.

Further, the decoupling mass will decouple at a frequency corresponding to the sum of the first and second static spring stiffness, resulting in a steeper slope of the transmissibility after the decoupling frequency which also has a positive effect on the vibration isolation performance.

For both the embodiments of FIGS. 3 and 4, the first and second static spring stiffness does not necessarily have to be the same, but especially in case of the first and second vibration isolation parts comprising a pneumatic isolator, it may be preferred for e.g. simplicity reasons to choose the first and second static spring stiffness to be equal.

Although the air supply 43 in the embodiment of FIG. 4 has been provided as being integral to the decoupling mass 30, it is also envisaged that the air supply is provided externally from the decoupling mass 30. However, it is preferred that in case two pneumatic isolators are used, the cross talk between the two isolators is minimized, more preferably prevented at all. In an embodiment, minimizing the cross-talk can be done by providing separate air supplies to the pneumatic isolators.

Although it seems that in the pneumatic isolators shown in FIGS. 3 and 4, the air is able to escape and should be replenished all the time, it is also possible to use sealed pneumatic isolators to prevent loss of air. This is also preferred when the vibration isolator is positioned in or near a vacuum environment.

Figure 5:
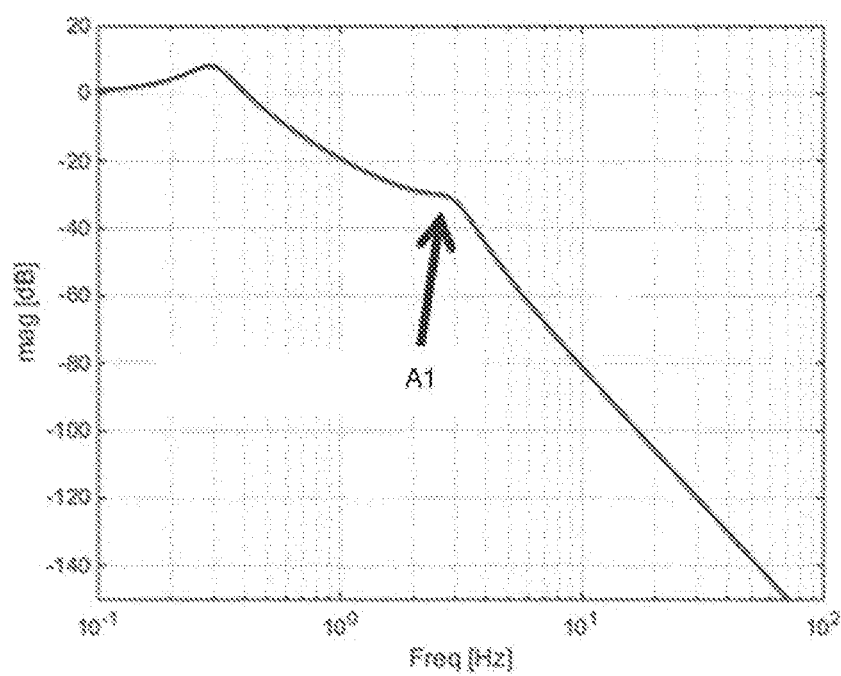
FIG. 5 depicts the vibration isolation performance of a vibration isolator according to the invention compared to a prior art vibration isolator.

FIG. 5 provides a transmissibility graph corresponding to the following numerical example without showing the isolation saturation.

In the numerical example resulting in the transmissibility graph of FIG. 5, it is assumed that the first and second static spring stiffness are equal to k, so that this vibration isolator corresponds to a prior art vibration isolator having a single vibration isolator part with static spring stiffness k/2. By using the decoupling mass, the decoupling mass will decouple at a frequency determined by the two parallel springs, having stiffness 2 k. Considering an original decoupling frequency of 0.3 Hz and a suspended mass of 1000 kg, the stiffness k can be determined by the following calculation, where m1 is the suspended mass and $\omega_1$ is the original decoupling frequency in radians and f1 is the original decoupling frequency in Hz:

$$\omega_1 = \sqrt{\left(\frac{k/2}{m_1}\right)} \rightarrow k = 2m_1(2\pi f_1)^2 = 2.1000(2\pi 0.3)^2 = 7100 \text{ N/m}$$

The weight of the decoupling mass will determine the decoupling frequency of the decoupling mass. In case a decoupling frequency of 3 Hz is chosen, the weight of the decoupling mass can be determined by the following calculation, where m2 is the weight of the decoupling mass, $\omega_2$ is the decoupling frequency in radians and f2 is the decoupling frequency in Hz:

$$\omega_2 = \sqrt{\left(\frac{2k}{m_2}\right)} \rightarrow m_2 = \left(\frac{2k}{\omega_2^2}\right) = \left(\frac{2.7100}{(2\pi \cdot 3)^2}\right) = 40 \text{ kg}$$

Hence, when the first and second static spring stiffness k1 and k2 are chosen equal, a decoupling mass of 40 kg is needed for an extra decoupling at 3 Hz indicated in FIG. 5 by arrow A1, which would lead to a −4 slope starting at 3 Hz.

It is to be noted that in this numerical example, the weight of the decoupling mass is much lower than a weight of the suspended mass. This is also preferred as a large decoupling mass may not be very practical and take a lot of space, not to mention adds a lot of weight to the total weight of the lithographic apparatus.

The decoupling mass is preferably a mass only suspended by the first and second vibration isolator parts. The first and second vibration isolator parts preferably comprise a single vibration isolator or spring, so that no parallel springs or isolators are connected to the decoupling mass. The vibration isolator may comprise actively controlled components. e.g. to keep the drift of the decoupling mass within limits or to provide a spring-like behavior.

In an embodiment, the decoupling mass is only connected to the first and second vibration isolator parts such that the outer dimensions of the decoupling mass are smaller than the outer dimensions of the base and/or coupling element. The outer dimensions of the decoupling mass are for instance at most 1 meter, preferably at most 0.5 meter. The vibration isolator is preferably housed within a housing, which housing only holds the vibration isolators and the decoupling mass.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A vibration isolator configured to support a vibration sensitive object in a supporting direction, the vibration isolator comprising:
   a base;
   a coupling element to be coupled to a vibration sensitive object;
   a decoupling mass;
   a first vibration isolator part arranged between the base and the decoupling mass; and
   a second vibration isolator part arranged between the decoupling mass and the coupling element, and wherein
   each of the first and second vibration isolator parts has only a single vibration isolator element, and
   the vibration isolator element of the first vibration isolator part is a pneumatic isolator configured to receive compressed air, and, in operational use, the decoupling mass is configured to move relative to the first vibration isolator part in the supporting direction, and the decoupling mass is suspended by the compressed air and the second vibration isolator part only.

2. The vibration isolator of claim 1, wherein the vibration isolator element of each of the first and second vibration isolator parts is a pneumatic isolator, and, in operational use, the first vibration isolator part is separated from the decoupling mass such that a first open space is between the decoupling mass and the first vibration isolator part, and the second vibration isolator part is separated from the decoupling mass such that a second open space is between the decoupling mass and the second vibration isolator part.

3. The vibration isolator of claim 2, wherein crosstalk between the pneumatic isolators of the first and second vibration isolator parts is minimized or prevented.

4. The vibration isolator of claim 3, further comprising a separate air supply for the pneumatic isolator of each of the first and second vibration parts to thereby minimize or prevent crosstalk.

5. The vibration isolator of claim 3, wherein the decoupling mass substantially blocks gas such that air that flows in the first open space flows around the decoupling mass.

6. The vibration isolator of claim 1, wherein a static stiffness of the first vibration isolator part is substantially equal to a static stiffness of the second vibration isolator part.

7. The vibration isolator of claim 1, wherein the pneumatic isolator is a sealed pneumatic isolator.

8. The vibration isolator of claim 1, wherein the base or coupling element comprises a chamber in which the decoupling mass is displaceably arranged.

9. The vibration isolator of claim 1, wherein the decoupling mass is configured to mechanically decouple the coupling element from the base at a decoupling frequency, and the decoupling frequency is based on a static stiffness of the first vibration isolator part and a static stiffness of the second vibration isolator part.

10. The vibration isolator of claim 1, wherein the decoupling mass comprises a recess configured to receive the coupling element.

11. The vibration isolator of claim 1, wherein the vibration isolator element of the first vibration isolator is a cylinder comprising a bottom portion and an interior, the interior of the cylinder being configured to receive the decoupling mass with a first end of the decoupling mass oriented toward the bottom portion, and the compressed air is received between the bottom portion and the first end of the decoupling mass.

12. The vibration isolator of claim 1, wherein the decoupling mass is a piston part or cylinder part of the pneumatic isolator.

13. A lithographic apparatus comprising:
a vibration sensitive object; and
a vibration isolator supporting the vibration sensitive object in a supporting direction, the vibration isolator comprising:
a base;
a coupling element coupled to the vibration sensitive object;
a decoupling mass;
a first vibration isolator part arranged between the base and the decoupling mass; and
a second vibration isolator part arranged between the decoupling mass and the coupling element, and wherein
each of the first and second vibration isolator parts has only a single vibration isolator element,
the vibration isolator element of the first vibration isolator part is a pneumatic isolator configured to receive compressed air, and, in operational use, the decoupling mass is configured to move relative to the first vibration isolator part in the supporting direction, and the decoupling mass is suspended by the compressed air and the second vibration isolator part only.

14. The lithographic apparatus of claim 13, wherein the vibration sensitive object is one of the following:
an illumination system configured to condition a radiation beam;
a projection system configured to project a patterned radiation beam onto a target portion of a substrate;
a stage assembly comprising a substrate table constructed to hold the substrate; or
a base frame supporting the illumination system, the projection system and/or the stage assembly.

15. The lithographic apparatus of claim 13, wherein the vibration isolator element of each of the first and second vibration isolator parts is a pneumatic isolator.

16. The lithographic apparatus of claim 15, wherein crosstalk between the pneumatic isolators of the first and second vibration isolator parts is minimized or prevented.

17. The lithographic apparatus of claim 13, wherein a static stiffness of the first vibration isolator part is substantially equal to a static stiffness of the second vibration isolator part.

18. The lithographic apparatus of claim 13, wherein the pneumatic isolator is a sealed pneumatic isolator.

19. A device manufacturing method comprising:
projecting a patterned beam of radiation onto a substrate using a lithographic apparatus to form an electronic device, the patterned beam interacting with at least one vibration sensitive object in the lithographic apparatus, the vibration sensitive object being supported by a vibration isolator in a supporting direction,
wherein the vibration isolator comprises:
a base;
a coupling element coupled to the vibration sensitive object;
a decoupling mass;
a first vibration isolator part arranged between the base and the decoupling mass; and
a second vibration isolator part arranged between the decoupling mass and the coupling element, and wherein
each of the first and second vibration isolator parts has only a single vibration isolator element,
the vibration isolator element of the first vibration isolator part is a pneumatic isolator configured to receive compressed air, and, in operational use, the decoupling mass is configured to move relative to the first vibration isolator part in the supporting direction, and the decoupling mass is suspended by the compressed air and the second vibration isolator part only.

20. The device manufacturing method of claim 19, further comprising projecting a conditioned beam of radiation onto a patterning device to form the patterned beam of radiation.

21. The device manufacturing method of claim 20, wherein at least one vibration sensitive object comprises the patterning device.

22. The device manufacturing method of claim 21, wherein the conditioned beam of radiation is projected by an illumination system, the at least one vibration sensitive object further comprises the illumination system, the patterning device is supported by a first vibration isolator, and the illumination system is supported by a second vibration isolator.

23. The device manufacturing method of claim 19, wherein the electronic device comprises an integrated circuit.

24. A vibration isolator configured to support a vibration sensitive object in a supporting direction, the vibration isolator comprising:
 a base;
 a coupling element to be coupled to a vibration sensitive object;
 a decoupling mass;
 a first vibration isolator part arranged between the base and the decoupling mass; and
 a second vibration isolator part arranged between the decoupling mass and the coupling element, and wherein each of the first and second vibration isolator parts provides only pneumatic isolation, and, in operational use, the decoupling mass is configured to move relative to the first vibration isolator part in the supporting direction, and the first vibration isolator part is separated from the decoupling mass such that a first open space is between the decoupling mass and the first vibration isolator part, and the second vibration isolator part is separated from the decoupling mass such that a second open space is between the decoupling mass and the second vibration isolator part.

25. The vibration isolator of claim 24, wherein one or more of the first vibration isolator part and the second vibration isolator part comprises a sealed pneumatic isolator.

26. The vibration isolator of claim 24, further comprising an air supply configured to provide compressed air to the second open space.

27. The vibration isolator of claim 26, wherein the air supply is integral to the decoupling mass.

* * * * *